United States Patent
Manola et al.

(10) Patent No.: US 12,539,541 B2
(45) Date of Patent: Feb. 3, 2026

(54) SILVER NANOPARTICLES SYNTHESIS METHOD FOR LOW TEMPERATURE AND PRESSURE SINTERING

(71) Applicant: STMICROELECTRONICS S.r.l., Agrate Brianza (IT)

(72) Inventors: Cristina Manola, Belpasso (IT); Rosa Lucia Torrisi, Calatabiano (IT); Simone Rascunà, Catania (IT); Gabriele Bellocchi, Catania (IT); Annalinda Contino, Valverde (IT); Giuseppe Maccarrone, Calatabiano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/492,356

(22) Filed: Oct. 1, 2021

(65) Prior Publication Data

US 2022/0108975 A1    Apr. 7, 2022

Related U.S. Application Data

(60) Provisional application No. 63/110,831, filed on Nov. 6, 2020, provisional application No. 63/087,694, filed on Oct. 5, 2020.

(51) Int. Cl.
*H01L 23/00* (2006.01)
*B22F 1/054* (2022.01)
(Continued)

(52) U.S. Cl.
CPC .............. *H01L 24/83* (2013.01); *B22F 1/054* (2022.01); *B22F 9/24* (2013.01);
(Continued)

(58) Field of Classification Search
CPC ........ B22F 3/10–1146; B22F 2304/054; B22F 2998/10; H01L 2224/29339;
(Continued)

(56) References Cited

U.S. PATENT DOCUMENTS

2010/0239750 A1* 9/2010 Breton .................... C09D 5/24
                                                     977/773
2012/0279766 A1* 11/2012 Wu ......................... C23C 14/35
                                                     252/514
(Continued)

OTHER PUBLICATIONS

Abrar, M.A. et al., "Bendable Electro-chemical Lactate Sensor Printed with Silver Nano-particles," *Science Report*, vol. 6, No. 30565, 2016, p. 1-9.
(Continued)

*Primary Examiner* — Jessica S Manno
*Assistant Examiner* — Stanetta D Isaac
(74) *Attorney, Agent, or Firm* — Seed Intellectual Property Law Group LLP (57) ABSTRACT

The disclosure is directed to wide band-gap semiconductor devices, such as power devices based on silicon carbide or gallium nitride materials. A power device die is attached to a carrier substrate or a base using sintered silver as a die attachment material or layer. The carrier substrate is, in some embodiments, copper plated with silver. The sintered silver die attachment layer is formed by sintering silver nanoparticle paste under a very low temperature, for example, lower than 200° C. and in some embodiments at about 150° C., and with no external pressures applied in the sintering process. The silver nanoparticle is synthesized through a chemical reduction process in an organic solvent. After the reduction process has completed, the organic solvent is removed through evaporation with a flux of inert gas being injected into the solution.

20 Claims, 3 Drawing Sheets (51) Int. Cl.
  B22F 9/24 (2006.01)
  H01L 23/495 (2006.01)
(52) U.S. Cl.
  CPC ........ H01L 23/49513 (2013.01); H01L 24/29 (2013.01); H01L 24/32 (2013.01); *B22F 2301/255* (2013.01); *B22F 2304/054* (2013.01); *H01L 23/49582* (2013.01); *H01L 24/73* (2013.01); *H01L 2224/29339* (2013.01); *H01L 2224/29499* (2013.01); *H01L 2224/32245* (2013.01); *H01L 2224/73265* (2013.01); *H01L 2224/83091* (2013.01); *H01L 2224/83192* (2013.01); *H01L 2224/8384* (2013.01); *H01L 2924/10272* (2013.01); *H01L 2924/1033* (2013.01); *H01L 2924/20105* (2013.01)
(58) Field of Classification Search
  CPC . H01L 2224/83439; H01L 2224/85439; H01L 24/83; H01L 24/29; H01L 24/32; H01L 24/73; H01L 24/48; H01L 24/75; H01L 2224/2929; H01L 2224/29294; H01L 2224/45099; H01L 2224/83203; H01L 2224/85444; H01L 2224/85455; H01L 2224/85464; H01L 2224/75272; H01L 2224/48247; H01L 2224/75101; H01L 2224/83097; H01L 2224/83194; H01L 2224/83444; H01L 2224/83447; H01L 2224/83455; H01L 2224/83464; H01L 2224/83948; H01L 2224/85447; H01L 2924/10272; H01L 2924/1033; H01L 2924/20105; H01L 2924/00014; H01L 2924/13055; H01L 2924/13091; H01L 2924/181

See application file for complete search history.

(56) References Cited

U.S. PATENT DOCUMENTS

| | | | | |
|---|---|---|---|---|
| 2014/0042624 | A1* | 2/2014 | Zommer | H01L 23/49562 257/741 |
| 2016/0024678 | A1* | 1/2016 | Chen | C25D 5/617 205/104 |
| 2018/0242451 | A1* | 8/2018 | Chopra | C09D 11/037 |
| 2018/0338379 | A1* | 11/2018 | Bemmerl | H05K 7/02 |
| 2019/0371757 | A1* | 12/2019 | Murayama | H01L 23/49844 |
| 2020/0236782 | A1* | 7/2020 | Ho | H01L 23/481 |

OTHER PUBLICATIONS

Bai, J.G. et al., "High-Temperature Operation of SiC Power Devices by Low-Temperature Sintered Silver Die-Attachment," *IEEE Transactions on Advanced Packaging*, vol. 30, No. 3, Aug. 2007, p. 506-510.

Carter, et al., "Sintering and Grain Growth," Ceramic Materials: Science and Engineering, 24, 2013, 32 pages.

Chen, Y. et al., "Novel phase-transfer preparation of monodisperse silver and gold nanoparticles at room temperature," *Materials Letters*, vol. 62, 2008, p. 2215-2218.

Contino, A. et al., "The pivotal role of copper(II) in the enantiorecognition of tryptophan and histidine by gold nanoparticles," *Analytical and Bioanalytical Chemistry*, vol. 406, 2014, p. 481-491.

Contino, A. et al., "Tyrosine capped silver nanoparticles: A new fluorescent sensor for the quantitative determination of copper(II) and cobalt(II) ions," *Journal of Colloid and Interface Science*, vol. 462, 2016, p. 216-222.

Contino, A. et al., "Synthesis and characterization of new tyrosine capped anisotropic silver nanoparticles and their exploitation for the selective determination of iodide ions," *Colloids and Surfaces A*, vol. 529, 2017, p. 128-136.

Daraio, C. et al., "Synthesis and Patterning Methods for Nanostructures Useful for Biological Applications," in Silva et al. (eds) *Nanotechnology for Biology and Medicine. Fundamental Biomedical Technologies*, Springer, New York, NY, 2012, p. 27-44.

Eustis, S. et al., "Why gold nanoparticles are more precious than pretty gold: Noble metal surface plasmon resonance and its enhancement of the radiative and nonradiative properties of nanocrystals of different shapes," *Chemical Society Reviews*, vol. 35, 2006, p. 209-217.

Garcia, M.A., "Corrigendum: Surface plasmons in metallic nanoparticles: fundamentals and applications," *Journal of Physics D: Applied Physics, IOP Publishing*, vol. 45, No. 38, 2012, 22 pages.

Jones, "Colloidal dispersions," Soft Condensed Matter, 4, Department of Physics and Astronomy, University of Sheffield, 29 pages.

Kelly et al., "Modeling Metal Nanoparticle Optical Properties," Modeling Optical Properties, 4, Northwestern University, Evanstan, Illinois, pp. 89-118.

Kelly, K.L. et al., "The Optical Properties of Metal Nanoparticles: The Influence of Size, Shape, and Dielectric Environment," *Journal of Physical Chemistry B*, vol. 107, Issue No. 3, Jan. 23, 2003, p. 668-677.

Klaka, S. et al., "Reduction of Thermomechanical Stress by applying a Low Temperature Joining Technique," Proc. of the 6th Intl. Symposium on Power Semiconductor Devices and IC's, Davos, Switzerland, May 31-Jun. 2, 1994, p. 259-264, downloaded on Oct. 28, 2018 from URL=https://ieeexplore.ieee.org/document/583736/citations#citations.

Lee, J.J. et al., "Silver complex inks for ink-jet printing: the synthesis and conversion to a metallic particulate ink," *Journal of Ceramic Processing Research*, vol. 8, No. 3, 2007, p. 219-223.

Lee, P.C. et al., "Adsorption and Surface-Enhanced Raman of Dyes on Silver and Gold Sols," *The Journal of Physical Chemistry*, vol. 86, No. 17, 1982, p. 3266-3267.

Li, Y. et al., "Facile Synthesis of Silver Nanoparticles Useful for Fabrication of High-Conductivity Elements for Printed Electronics," *Journal of the American Chemical Society*, vol. 127, No. 10, 2005, p. 3266-7.

Malinsky, M.D. et al., "Chain Length Dependence and Sensing Capabilities of the Localized Surface Plasmon Resonance of Silver Nanoparticles Chemically Modified with Alkanethiol Self-Assembled Monolayers," *Journal of the American Chemical Society*, vol. 123, No. 7, 2001, p. 1471-1482.

Manola, C., "Synthesis and Characterization of Silver Nanoparticles for the preparation of sintering pastes on power electronic devices," *Experimental Degree Thesis, University of Catania, Italy. Department of Chemical Sciences. Master's Degree Course in Materials Chemistry*, Academic Year 2018-2019, 84 pages (machine generated English translation).

Ozpineci, B. et al., "Comparison of Wide-Bandgap Semiconductors for Power Electronics Applications," *Oak Ridge National Laboratory*, Dec. 12, 2003, 34 pages.

Paeng, D. et al., "Laser wavelength effect on laser-induced photothermal sintering of silver nanoparticles," *Applied Physics A, Materials Science & Processing*, vol. 120, 2015, p. 1229-1240.

Paramelle, D. et al., "Rapid method to estimate the concentration of citrate capped silver nanoparticles from UV-visible light spectra" *Analyst*, vol. 139, No. 19, 2014, p. 1-7.

Pillai, Z.S. et al., "What Factors Control the Size and Shape of Silver Nanoparticles in the Citrate Ion Reduction Method?," *Journal of Physical Chemistry B*, vol. 108, No. 3, 2004, p. 945-951.

Polte, J. et al., "Formation Mechanism of Colloidal Silver Nanoparticles: Analogies and Differences to the Growth of Gold Nanoparticles," *ACS Nano*, vol. 6, No. 7, 2012, p. 5791-5802.

Scheuermann, U. et al., "Low Temperature Joining Technology—A High Reliability Alternative to Solder Contacts," Workshop on Metal Ceramic Materials for Functional Applications, Wien, Austrua, Jun. 1997, downloaded on Sep. 11, 2015 from URL=https://www.researchgate.net/publication/267794221,13 pages.

Schwarzbauer, H. et al., "Novel Large Area Joining Technique for Improved Power Device Performance," *IEEE Transactions on Industry Applications*, vol. 27, No. 1, 1991, p. 93-95.

(56) References Cited

OTHER PUBLICATIONS

Singh, R et al., "High Temperature SiC Trench Gate p-IGBTs," *IEEE Transactions on Electron Devices*, vol. 50, No. 3, Mar. 2003, p. 774-784.

Sun, Y., "Controlled synthesis of colloidal silver nanoparticles in organic solutions: empirical rules for nucleation engineering," *Chemical Society Review*, vol. 42, 2013, 2497-2511.

Wang, X.W. et al., "High Temperature (450° C.) Reliable NMISFET's on P-type 6H—SiC," *International Electron Devices Meeting. Technical Digest Cat. No. 99CH36318*, Washington, DC, USA, Dec. 5-8, 1999, p. IEDM99-209-IEDM99-212.

Wondrak, W. et al., "SiC Devices for Advanced Power and High-Temperature Applications," *Short Papers, IEEE Transactions on Industrial Electronics*, vol. 48, No. 2, Apr. 2001, p. 307-308.

Wong, C. et al., "Recent Advances in Plastic Packaging of Flip-Chip and Multichip Modules (MCM) of Microelectronics," *IEEE Trans. on Components and Packaging Tech.*, vol. 22, No. 1, Mar. 1999, p. 21-25.

\* cited by examiner

$$CH_3COOAg \xrightarrow[RNH_2]{PhNHNH_2, \text{ Organic solvent}} AgNPs - RNH_2$$

FIG. 3B

N₂ INJET

302

SILVER NANOPARTICLES SYNTHESIS METHOD FOR LOW TEMPERATURE AND PRESSURE SINTERING

BACKGROUND

Technical Field

Embodiments of the present disclosure are directed to semiconductor packages and assembling technology.

Description of the Related Art

In recent decades, power electronics have found widespread use in industrial applications including the automotive industry sector of electric and hybrid electric vehicles. Power electronic devices used in the industry meet stringent reliability and durability requirements. They are capable of operating at elevated temperatures for long periods of time. The maximum junction temperature limit for most silicon-based electronic components is 150° C., which is often lower than the operation temperatures of the industrial applications. Pure or doped silicon, therefore, does not offer good performances under certain working conditions of industrial applications.

The power devices based on wide bandgap semiconductors, such as silicon carbide and gallium nitride, can operate at elevated temperatures. In wide bandgap semiconductors, the energy of the bandgap is approximately three times that of silicon, therefore, the electrons in the valence band need more heat energy to switch to the conduction band. The wider the semiconductor bandgap, the higher the operating temperature limit of the device.

The performances of power electronic devices are influenced by the electrical, thermal and mechanical properties of the materials used for bonding a power device die to a substrate in packaging. Current die bonding technologies have limitations in high temperature operations. Solder alloys and conductive adhesives usually have relatively low melting or degradation temperatures and have unsatisfactory thermal and electrical conductivities for wide bandgap devices.

BRIEF SUMMARY

The disclosure is directed to wide band-gap semiconductor devices, such as power devices based on silicon carbide or gallium nitride materials. A power device die, e.g., a silicon carbide die, is attached to a carrier substrate or a base using sintered silver as a die attachment material or layer. The carrier substrate is, in some embodiments, copper plated with silver. Other embodiments of the carrier substrate may include bare copper, copper plated with nickel, copper plated with gold, direct bond copper aluminum nitride, or other suitable substrates.

The sintered silver die attachment layer is formed by sintering silver nanoparticle paste under a very low temperature, for example, lower than 200° C. and in some embodiments at about 150° C., and under a pressures lower than or equal to 5 MPa (megapascal) or without an external pressure being applied in the sintering process. The silver nanoparticle paste does not contain polymer binder such that the resultant sintered silver is polymer free.

In some embodiments, the silver nanoparticle is synthesized through a chemical reduction process in an organic solvent. The mixture solution does not contain sodium or potassium elements. After the reduction process has completed, the organic solvent is removed through evaporation with a flux of inert gas being injected into the solution. Resultantly, the synthesized silver nanoparticles have relatively small sizes and well-controlled shapes.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
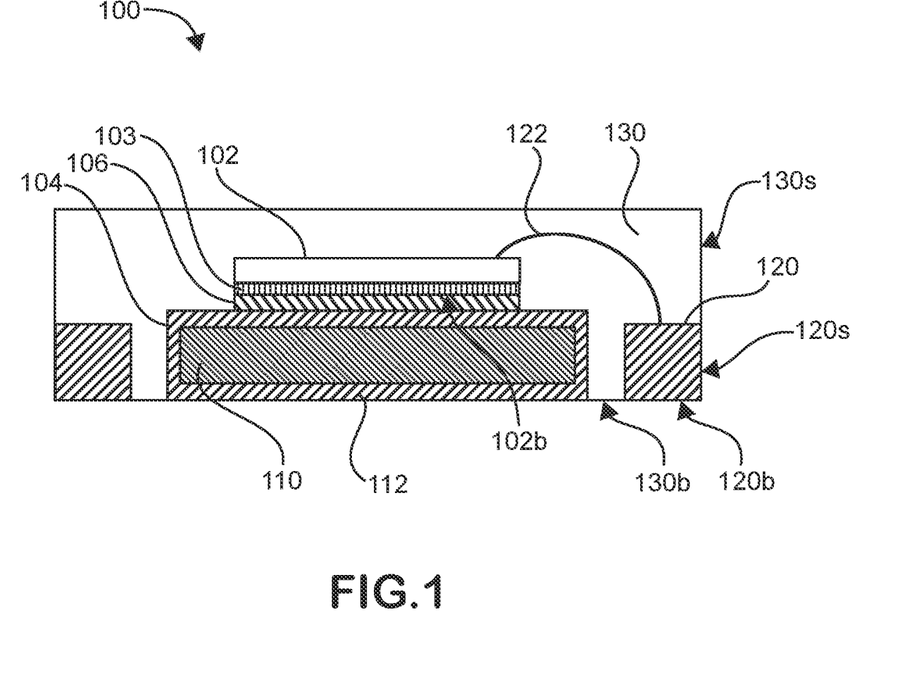
FIG. 1 is a cross-sectional view of a semiconductor package according to embodiments of the disclosure.

FIG. 1 is a cross-sectional view of a semiconductor package 100 of a semiconductor device. The package 100 includes a semiconductor die 102, e.g., a wide bandgap semiconductor die, a substrate 104 and a die attachment or bonding layer 106. The bonding layer 106 is sintered silver and provides attachment and one or more of thermal or electrical conductivity between the die 102 and the substrate 104. The semiconductor die 102 may include any semiconductor device, for example, a power device such as a metal oxide semiconductor field effect transistor (MOSFET), a high electron mobility transistor (HEMT), or an insulated-gate bipolar transistor (IGBT) based on a wide bandgap semiconductor such as silicon carbide SiC, gallium nitride GaN, other wide bandgap semiconductor materials, or other semiconductor materials, e.g., silicon. In some embodiments, the semiconductor die 102 may include a metal or conductive plating layer 103 or one or more metal or conductive plated regions (not specifically shown for simplicity) on a surface 102b of the die 102 that interfaces with the bonding layer 106.

The substrate 104 includes a metal material. In some embodiments, the substrate 104 includes a base portion 110 and at least one metal plating layer 112 or one or more plated surface regions (not specifically shown for simplicity). The base portion 110 is sufficiently strong to provide physical support for the semiconductor die 102 and in some configurations to provide a heat sink for the semiconductor die 102. The base portion 110 may be copper, copper alloy like copper-molybdenum-copper laminate, aluminum, aluminum alloy, silicon carbide, or a ceramic material like aluminum oxide or aluminum nitride or other suitable materials. The metal plating layer or metal plating surface region 112, referred to together as "plating layer 112" for descriptive purposes, may be palladium, gold, silver, nickel or other noble metal materials. In some embodiments, the base portion 110 is copper and the plating layer 112 is silver. In some embodiments, the base portion is aluminum nitride ceramic and the plating layer 112 is copper directly bonded on the aluminum nitride. FIG. 1 shows that the plating layer 112 is on the base portion 110 throughout surfaces of the base portion 110. This example does not limit the scope of the disclosure. In some other embodiments, the plating layer 112 is formed on discrete regions on a surface of the base portion 110, for example, the surface regions that overlap the semiconductor die 102.

FIG. 1 shows, as an illustrative example, that a continuous layer of sintered silver bonding layer 106 is positioned between the semiconductor die 102 and the substrate 104. This example does not limit the scope of the disclosure. In some embodiments, there are multiple discrete or connected bonding elements 106 of sintered silver between the semiconductor die 102 and the substrate 104. Each of the multiple bonding elements 106 interfaces with a plating conductive region 103 of the semiconductor die 102 and a plating layer 112 of the substrate 104.

The package 100 includes a plurality of leads or pins 120, referred to as "leads" for descriptive purposes. At least some leads 120 are connected to the semiconductor die 102 through wires 122. The leads 120 include a conductive material. The leads 120 may include a same material composition or combination as the substrate 104 or may include different material composition or combination from those of the substrate 104. The semiconductor die 102 may also be connected to other elements of the package 100 through conductive clips, wire bonds, ribbon bonds, stacked dies, solder bumps, or other connection features through surfaces of the die 102 other than the surface 102b that interfaces with the bonding layer 106, which are not specifically illustrated for simplicity purposes.

An encapsulation layer 130 is on the die 102, the leads 120 and the wires 122. In some embodiments, the die 102 and the wires 122 are fully encapsulated within the encapsulation layer 130. The leads 120 each include portions or surfaces that are exposed from the encapsulation layer 130. FIG. 1 shows that the lead 120 includes an edge surface 120s and a lower surface 120b exposed from the encapsulation layer 130 and substantially plumb or coplanar with the adjacent sidewall surface 130s or lower surface 130b of the encapsulation layer 130. This illustrative example does not limit the scope of the disclosure. For example, the leads 120 may protrude out of the encapsulation layer 130. Specifically, for example, one or more of the edge surface 120s or the lower surface 120b of a lead 120 may extend beyond the adjacent sidewall surface 130s or lower surface 130b of the encapsulation layer 130.

Inventors have recognized that reduced sinter pressure in sintering of silver nanoparticles improves throughputs and reliability. At the same time, to avoid premature particle agglomeration, much more additives, compared to microsized particles, are typically added to the composition of the silver nanoparticle paste. The sintering process is then complicated by the outgassing of these additives during the sintering process. For example, the resultant sintered silver layer may include 30% of porosity or higher. The mechanical properties of such porous sintered silver layer are not satisfactory.

Figure 2A:
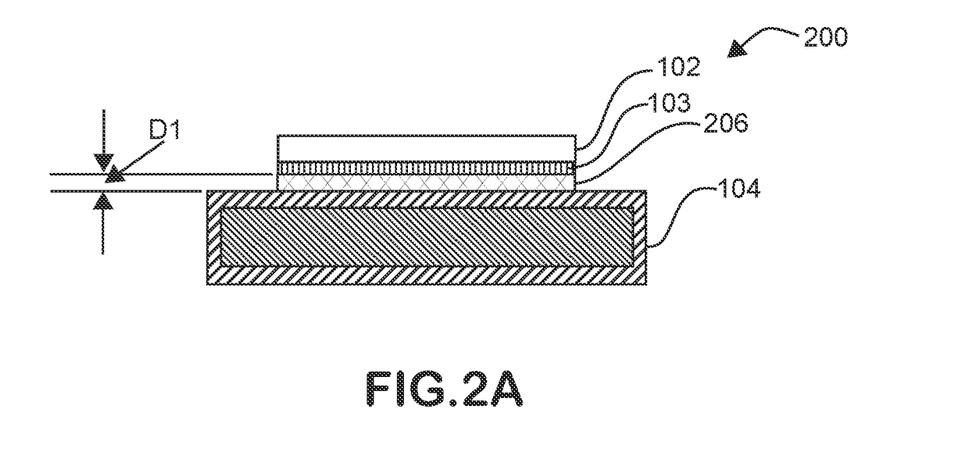
FIGS. 2A and 2B illustrate various stages of a system in a packaging process according to embodiments of the disclosure.
Figure 2B:
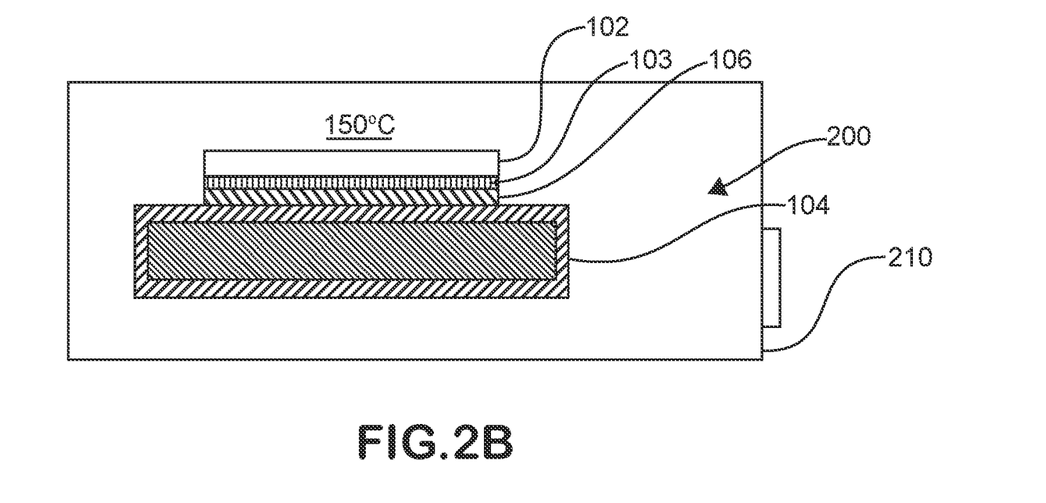

FIGS. 2A and 2B are a process of forming the silver bonding layer 106 through low temperature sintering of silver nanoparticles. As shown in FIG. 2A, a system 200 includes a silver nanoparticle paste 206 positioned between the semiconductor die 102 and the substrate 104. In some embodiments, the silver nanoparticles of the silver nanoparticle paste 206 each has a diameter less than or equal to 20 nm. In some embodiments, the silver nanoparticles each have a diameter less than or equal to 10 nm. In some embodiments, the silver nanoparticles each have a diameter in a range of 3 nm and 7 nm, including 3 nm and 7 nm. In some embodiments, the silver nanoparticles each have a diameter in a range of 4 nm and 5 nm, including 4 nm and 5 nm. Because, in these embodiments, the silver nanoparticles are less susceptible to aggregation, they have smaller sizes. The silver nanoparticles contain substantially no contaminant ions such as sodium and potassium ions. In some embodiments, the silver nanoparticle paste 206 may include less amount of dispersing agent, e.g., a fatty acid or cycloalkane, as compared to the case that the sizes of the silver nanoparticle are not well controlled. The dispersing agent functions to prevent the silver nanoparticles from agglomerating together before the sintering procedure, ensuring homogeneity and dispensability of the paste.

For example, in some embodiments, cyclohexane is used as the dispersing agent and has a weight percentage of about 50% in the silver nanoparticle paste 206. In some embodiments, the silver nanoparticle paste 206 contains no or less amount of polymer binder, which is typically used to enhance the structural solidity of the paste during a sintering procedure. In some embodiments, because of the smaller diameter sizes of the silver nanoparticles, e.g., 3-7 nm, and because no external pressure is used in the sintering procedure, as will be described herein, no polymer binder is added to the silver nanoparticle paste 206. The absence of polymer components in the silver nanoparticle paste 206 ensures that the sintered silver bonding layer 106, as described herein, does not contain the detrimental polymer residual.

In some embodiments, the silver nanoparticle paste 206 is applied onto a surface of the substrate 104 through stencil printing. Other suitable approaches, e.g., screen printing, are also possible and included in the disclosure. In some embodiments, the silver nanoparticle paste may be prepared beforehand and may be transferred onto the surface of the substrate 104 for die placement. The silver nanoparticle paste 206 is printed with an initial thickness in a range between about 20 micrometers and about 120 micrometers, although other thickness values are also possible. In the process of die placement, the semiconductor die 102 may be pushed down against the silver nanoparticle paste 206 such that a thickness D1 of the silver nanoparticle paste 206 after the semiconductor die 102 has been placed thereon may be smaller than the initial thickness, and may be in a range between about 15 micrometers and about 120 micrometers.

In some embodiments, the silver nanoparticle paste 206 is placed on a designated surface region of the substrate 104 for receiving a semiconductor die thereon. The silver nanoparticle paste 206 may be positioned on multiple surface regions of the substrate 104 designated to receive a same semiconductor die 102. The multiple surface regions may connect to one another or may be separated from one another.

FIG. 2B illustrates the sintering process that transfers or transitions the silver nanoparticle paste 206 into the silver bonding layer 106. In some embodiments, the sintering is carried out in an oven 210 with a sintering temperature that is lower than 200° C. In some embodiments, in the system 200, including the substrate 104, the silver nanoparticle paste 206 and the semiconductor die 102 are initially heated to and maintained at an initial temperature, e.g., in a range of 50-100° C. including 50° C. and 100° C., that is below the sintering temperature for a duration of about 15-30 minutes. The system 200 is then heated from the initial temperature to the sintering temperature with an inert gas, e.g., nitrogen or argon, filling in the oven. The oven temperature is increased in increments of a range of 5° C. and 25° C. including 5° C. and 25° C. or with a ramp rate in a range of 10° C. per minute and 20° C. per minute. After the temperature has been increased to the sintering temperature, e.g., at 150° C., the temperature is maintained at the sintering temperature level for a duration of about 15 minutes to about 1.5 hours, e.g., 1 hour. Thereafter, the temperature in the oven 210 is decreased, e.g., in a linear descent ramp of 20° C.-50° C. per minute, to the initial temperature or to room temperature.

In some embodiments, during the sintering procedure, no external pressure was applied to the system 200. In some embodiments, a very low external pressure, e.g., in the range of 1 MPa and 5 MPa including 1 MPa and 5 MPa, is applied on the die 102 against the silver nanoparticle paste 206 during the sintering procedure.

Optionally, after having been treated in the oven 210, the system 200 is subjected to a post-treatment in air. For example, the post-treatment is performed on a plate heated to a temperature in a range of 150° C. and 200° C. including 150° C. and 200° C. The post-treatment in air may improve the morphology and the electrical conductivity properties of the resulting silver bonding layer 106.

In some embodiments, the resulting silver bonding layer 106 is less porous, e.g., having less than or equal to 15 percent porosity. The silver bonding layer 106 contains little or no contaminant ions like sodium and potassium ions such that the electrical conductivity of the silver bonding layer 106 is improved. Further, in some embodiments, there are little or no polymer residuals contained in the silver bonding layer 106.

Figure 3A:
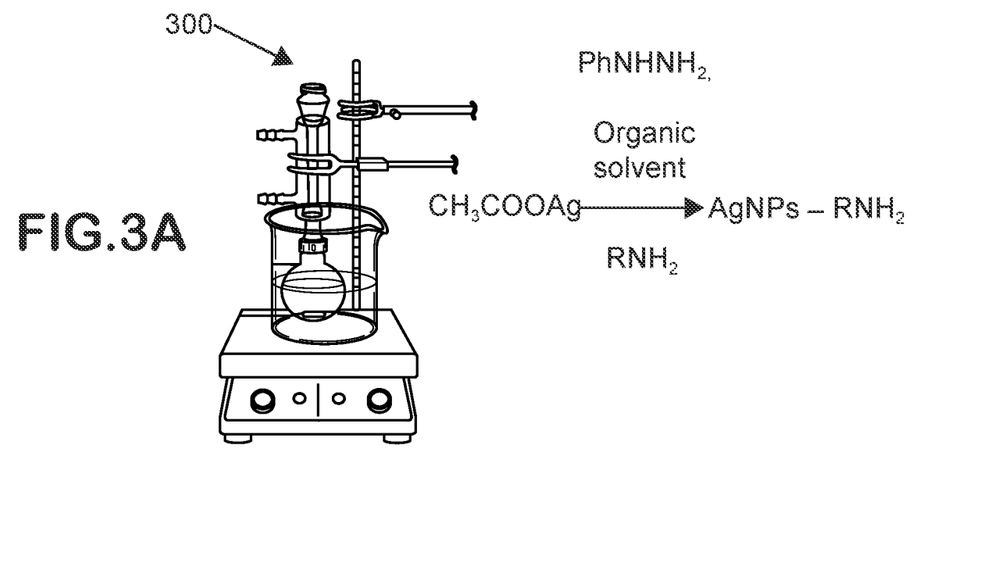
FIGS. 3A and 3B illustrate a process of synthesizing silver nanoparticles according to embodiments of the disclosure.
Figure 3B:
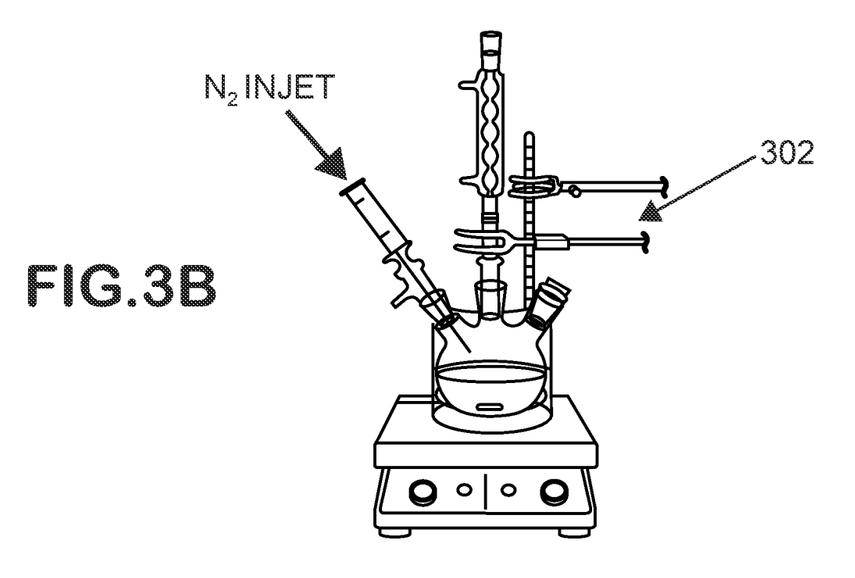

FIGS. 3A and 3B show an example process of making silver nanoparticles. FIG. 3A shows a procedure 300 of synthesizing silver nanoparticles through chemical reduction using an organic solvent and a reducing agent. Multiple approaches may be used to implement the chemical reduction process. In an embodiment, silver nanoparticles were synthesized through a hot reduction approach. Sodium citrate ($Na_3C_6H_5O_7$) is used both as a reducing agent and as a stabilizer. For example, a solution is made by dissolving silver nitrate ($AgNO_3$) in water. The solution is brought to a boil. Subsequently, 1% sodium citrate solution was added into the solution dropwise and under stirring to make a mixture solution. The mixture solution was kept at boiling under reflux for 1 hour (up to 60 minutes) to generate silver nanoparticle.

In an embodiment, silver nanoparticles were synthesized through a cold reduction approach. Sodium borohydride ($NaBH_4$) is used as a reducing agent and sodium citrate is used as a stabilizer. Sodium borohydride ($NaBH_4$) solution is added to water, which is placed in an ice-bath flask for half an hour and under stirring. Silver nitrate ($AgNO_3$) is added, and finally a sodium citrate solution is added.

In an embodiment, Silver nanoparticles were synthesized in an organic solvent like toluene ($C_7H_8$), using phenylhydrazine ($C_6H_5NHNH_2$ or $PhNHNH_2$) as a reducing agent and 1-hexadecylamine ($C_{16}H_{35}N$) or amine $RNH_2$ as stabilizer or capping agent. The stabilizer or capping agent in the mixture solution functions to restricts the silver nanoparticle from growing. Moreover, the steric forces as a result of surfactant caused by the capping agent keep the silver nanoparticles separated from one another, which prevents the aggregation of the silver nanoparticles. The mixture solution of silver acetate ($CH_3CO_2Ag$ or $AgC_2H_3O_2$) and 1-hexadecylamine ($C_{16}H_{35}N$) in the organic solvent was heated to a relatively low temperature, in some embodiments, about 50° C. or in a range of 35° C. and 60° C. including 35° C. and 60° C. A solution of phenylhydrazine in an organic solvent was added to the heated mixture solution dropwise and under stirring. The reaction mixture is kept for 1 hour at the relatively low temperature, e.g., about 50° C. or in a range of 35° C. and 60° C. including 35° C. and 60° C., and is subsequently allowed to cool to room temperature, e.g., at about 20° C.

In this approach, the reaction mixture does not contain sodium or potassium elements. As such, the synthesized silver nanoparticles do not contain contaminant sodium or potassium ions. As such, a sintered silver nanoparticle layer made from the silver nanoparticles will not contain contaminant sodium or potassium ions that tends to decrease the electrical conductivity of the sintered silver nanoparticle.

Other approaches of synthesizing silver nanoparticles through chemical reduction are also possible and included in the scope of the disclosure.

FIG. 3A shows an example reaction mixture of silver acetate, phenylhydrazine, and $RNH_2$ for illustration purposes, which does not limit the scope of the disclosure.

FIG. 3B shows a procedure 302 to remove the liquid organic solvent from the solid silver nanoparticles. In some embodiments, the excess phenylhydrazine, if any, was removed using acetone ($C_3H_6O$). The organic solvent is removed through evaporation with a flux of inert gas, e.g., nitrogen ($N_2$) or argon (Ar), being injected into the mixture solution and a container that contains the mixture solution. The inert gas is selected to be not reactive with any of the components in the mixture solution. In some embodiments, the inert gas, e.g., nitrogen, is injected with a pressure in a range of 1 bar and 2 bar including 1 bar and 2 bar and for a duration in the range of 45 minutes and 90 minutes including 45 minutes and 90 minutes. With the organic solvent being removed through evaporation, the nanoparticles are precipitated in the form of brown-colored powders. The introduction of the inert gas in the solvent evaporation helps to control the size of the silver nanoparticles to be less than 20 nm in diameter. In some embodiments, the resulting silver nanoparticles have an average diameter of in the range of 4 nm and 5 nm including 4 nm and 5 nm. Because the silver nanoparticles are less susceptible to aggregation, they have smaller sizes. As such, the shapes of the silver nanoparticles are more uniform and in some embodiments, predominantly spherical.

Such silver nanoparticles with relatively small sizes and no contaminant sodium and potassium ions are suitable for the sintering process of FIGS. 2A and 2B, which involves low sintering temperature of less than 200° C. and lower or no external pressure on the silver nanoparticle paste 206.

The disclosure herein provides many different embodiments, or examples, for implementing different features of the described subject matter. Specific examples of components and arrangements are described above to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "," "below," "lower," "above,"" "and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the description herein, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The various embodiments described above can be combined to provide further embodiments. Aspects of the embodiments can be modified to provide yet further embodiments. U.S. Provisional Application No. 63/087,694, filed on Oct. 5, 2020, is incorporated herein by reference in its entirety.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
applying silver nanoparticle paste on a first region of a surface of a substrate, the silver nanoparticle paste comprising around 50% cyclohexane by weight;
placing a semiconductor die on the silver nanoparticle paste, the semiconductor die having a first sidewall opposite a second sidewall along a first direction; and
forming a silver bonding layer between the substrate and the semiconductor die by sintering the silver nanoparticle paste in an oven with a sintering temperature lower than 200° C., the silver bonding layer being a continuous layer extending entirely from the first sidewall of the semiconductor die to the second sidewall, the silver bonding layer having a third sidewall coplanar with the first sidewall and a fourth sidewall coplanar with the second sidewall, the sintering the silver nanoparticle comprising:
heating the oven to an initial temperature in a range of 50° C. and 100° C. with a rate of increase in temperature in the range of 10° C. and 20° C. per minute;
maintaining the initial temperature of the oven for a duration in a range of 15 minutes and 30 minutes;
filling the oven with an inert gas; and
heating the oven from the initial temperature to the sintering temperature.

2. The method of claim 1 wherein the applying the silver nanoparticle paste on the first region of the surface of the substrate includes applying the silver nanoparticle paste on the first region that includes a first conductive material.

3. The method of claim 2 wherein the first conductive material of the first region is a plating layer.

4. The method of claim 3 wherein the substrate includes a base portion, and the plating layer is on the base portion, the base portion including one of a second conductive material or a ceramic material.

5. The method of claim 1 wherein the semiconductor die includes a conductive material on a surface area of the semiconductor die that interfaces with the silver nanoparticle paste.

6. The method of claim 1 wherein the sintering temperature is, at highest, 150° C.

7. The method of claim 1 wherein in the sintering the silver nanoparticle paste, no external pressure is applied on the silver nanoparticle paste.

8. The method of claim 1 wherein the silver bonding layer is free of polymer.

9. The method of claim 1 wherein a silver nanoparticle in the silver nanoparticle paste has a diameter that is, at greatest, 20 nm.

10. The method of claim 9 wherein the silver nanoparticle has a diameter in a range of 4 nm and 5 nm.

11. A method, comprising:
applying silver nanoparticle paste on a first region of a substrate via stencil printing, the silver nanoparticle paste being around 50% cyclohexane by weight percentage;
forming a silver bonding layer between the substrate and a semiconductor die by sintering the silver nanoparticle paste in an oven with a sintering temperature lower than 200° C., the semiconductor die having a first sidewall opposite a second sidewall along a first direction, the silver bonding layer being a continuous layer extending entirely from the first sidewall of the semiconductor die to the second sidewall of the semiconductor die along the first direction, the sintering the silver nanoparticle paste comprising:
heating the oven to an initial temperature that is below the sintering temperature, the heating the oven including increasing the oven temperature by increments in the range of 5° C. and 25° C. with a rate of increase in temperature in the range of 10° C. and 20° C. per minute; and
filling the oven with an inert gas.

12. The method of claim 11 wherein the applying the silver nanoparticle paste on the first region of a surface of the substrate includes applying the silver nanoparticle paste on the first region that includes a first conductive material.

13. The method of claim 12 wherein the first conductive material of the first region is a plating layer.

14. The method of claim 13 wherein the substrate includes a base portion, and the plating layer is on the base portion, the base portion including one of a second conductive material or a ceramic material.

15. A method, comprising:
forming silver nanoparticle paste on a first region of a surface of a substrate, the silver nanoparticle paste comprising around 50% cyclohexane by weight;
forming a semiconductor die on the silver nanoparticle paste, the semiconductor die having a first surface opposite a second surface along a first direction; and
forming a silver bonding layer between the substrate and the semiconductor die by sintering the silver nanoparticle paste with a sintering temperature lower than 200° C., the silver bonding layer having a first surface coplanar with the first surface of the semiconductor die and a second surface coplanar with the second surface of the semiconductor die, the second surface of the silver bonding layer being opposite the first surface of the silver bonding layer along the first direction.

16. The method of claim 15 wherein the sintering the silver nanoparticle paste comprises:
heating an oven to an initial temperature;
filling the oven with an inert gas; and
heating the oven from the initial temperature to the sintering temperature.

17. The method of claim 15 wherein the forming silver nanoparticle paste includes stencil printing.

18. The method of claim 15 wherein the forming the silver nanoparticle paste includes printing the silver nanoparticle paste with a first thickness in a range of 20 micrometers and 120 micrometers.

19. The method of claim 18 further comprising, during the forming a semiconductor die on the silver nanoparticle paste, compressing the silver nanoparticle paste to a second thickness that is smaller than the first thickness.

20. The method of claim 19 wherein the second thickness is in the range of 15 micrometers and 120 micrometers.

* * * * *